United States Patent [19]
Izadpanah

[11] Patent Number: 4,734,910
[45] Date of Patent: Mar. 29, 1988

[54] SELF MODE LOCKED SEMICONDUCTOR LASER DIODE

[75] Inventor: Hossein Izadpanah, Randolph, N.J.

[73] Assignee: Bell Communications Research, Inc., Livingston, N.J.

[21] Appl. No.: 29,802

[22] Filed: Mar. 25, 1987

[51] Int. Cl.$^4$ .......................................... H01S 3/098
[52] U.S. Cl. ...................................... 372/18; 372/38; 372/92
[58] Field of Search ............ 372/92, 38, 18, 25, 372/29, 700, 33, 108

[56] References Cited

U.S. PATENT DOCUMENTS 4,464,759  8/1984  Haus et al. ........................... 372/18
4,667,331  5/1987  Alferness et al. .................... 372/18

OTHER PUBLICATIONS

"Subpicosecond Pulses from Passively Mode-Locked GaAs Buried Optical Guide Semiconductor Laser", *Appl. Phys. Lett.*, J. P. van der Ziel et al., 39 (7), 1 Oct. 1981, pp. 525–527.

"Generation of Subpicosecond Pulses from an Actively Mode-Locked GaAs Laser in an External Ring Cavity", *Appl. Phys. Lett.*, J. P. van der Ziel et al, 39 (11), 1 Dec. 1981, pp. 867–869.

"Self-Sustained Picosecond Pulse Generation in a GaAlAs Laser at an Electrically Tunable Repetition Rate by Optoelectronic Feedback", *Appl. Phys. Lett.*, K. Y. Lau et al., 45 (2), 15 Jul. 1984, pp. 124–126.

*Primary Examiner*—Leon Scott, Jr.
*Attorney, Agent, or Firm*—James W. Falk; Daniel R. McGlynn

[57] ABSTRACT

A semiconductor laser diode which operates in an extended optical cavity in conjunction with a negative resistance device such as a Gunn diode for sustained mode-locked operation. The circuit is capable of generating high repetition rate picosecond optical pulses and is suitable for monolithic or hybrid implementation.

9 Claims, 3 Drawing Figures $\tau$: PULSE WIDTH
$T_t$: PULSE REPETITION PERIOD

SELF MODE LOCKED SEMICONDUCTOR LASER DIODE

Background of the Invention

1. Field of the Invention

The invention relates to semiconductor laser diodes and in particular to compact mode-locked laser systems that include a semiconductor laser diode and an external reflector for generating high repetition rate optical pulses.

2. Description of the Prior Art

Picosecond optical pulse sources play an important role in the study of ultra-fast processes and have potential application to high-speed electronics. Interest in such techniques has recently been stimulated by the generation of picosecond pulses at high repetition rate, but conventional sources have remained large and cumbersome laboratory systems. Semiconductor laser diodes have been suggested as compact picosecond pulse generators. Such a compact laser pulse generator has a number of practical uses. Among such uses are optical communications, ultra-fast computers, testing of optical fibers, producing one-hundred percent modulation of a laser at GHz repetition rates, testing optical switches and gates, testing fast detectors and optical sampling of fast phenomena, picosecond spectroscopy, investigation of material properties, fast electronics, and so forth. There are various types of picosecond laser sources known in the prior art, and a brief discussion of such technology is in order.

A typical laser consists of two essential elements: gain and feedback. A beam of light passing through the gain, or amplifying, medium stimulates it to release its stored energy in the form of additional light that adds to, or amplifies, the beam. Feedback is achieved by placing the gain medium within a resonator (a set of mirrors that reflects the beam back and forth through the gain medium). As a result of this cumulative process, an intense coherent beam of light is produced. The light from such a laser is composed of a number of discrete wavelengths corresponding to different resonant frequencies, or modes, of the resonator.

The total output of such a laser as a function of time will depend on the amplitudes, frequencies, and relative phases of all of these oscillating modes. If there is nothing which fixes these parameters, random fluctuations and nonlinear effects in the laser medium will cause them to change with time, and the output will vary in an uncontrolled way. If the oscillating modes are forced to maintain equal frequency spacings with a fixed phase relationship to each other, however, the output as a function of time will vary in a well-defined manner. The laser is then said to be mode-locked. The form of this output will depend on which laser modes are oscillating and what phase relationship is maintained. The major interest in mode-locking is as a means of generating trains of ultra-short light pulses, although other types of mode-locking leading to FM-modulated or spatially scanning laser beams are also possible.

A more precise definition of mode-locking is when all of the laser's resonant longitudinal modes are generated in phase to produce a Fourier sum. This yields a series of pulses having a repetition rate corresponding to m C/2L, where C is the speed of light in a vacuum, L is the cavity length and m is an integer. Such mode-locking is achieved by supplementing the internal laser cavity with an external mirror cavity. A mirror is disposed a particular distance from the crystal so that the combined cavity length is L. The external mirror provides a reflective surface for photon resonance. Picosecond optical pulse generation from laser diodes have been demonstrated by several techniques including passive and active mode-locking, optoelectronic feedback, and mutual phase-locked loop. For passive or active mode-locking, the diode normally operates in an extended external optical cavity, with a saturable absorber used for passive and a rf modulating source for active mode-locking. Prior to the present invention, it has not been practical to achieve self-sustained mode-locking capable of producing picosecond optical pulses from a laser diode based on the concept of switching transients and injection locking. The present invention has, in addition to the characteristics of conventional mode-locked lasers, the advantages of being self-sustained and achieves 6 to 10 times shorter pulses and order of magnitude of higher temporal stability of pulsation than previously available.

The following references provide background information on mode-locked lasers and are relevant to the present invention:

1. "Subpicosecond Pulses From Passively Mode-Locked GaAs Buried Optical Guide Semiconductor Laser", J. P. van der Ziel, W. T. Tsang, R. A. Logan, R. M. Mikulyak and W. M. Augustniak, *Appl. Phys. Lett.* 39 (7)1 Oct. 1981, pp. 525–527;
2. "Generation of Subpicosecond Pulses From an Actively Mode-Locked GaAs Laser in an External Ring Cavity", J. P. van der Ziel, R. A. Logan, and R. M. Mikulyak, *Appl. Phys. Lett.* 39, (11), 1 Dec. 1981 pp. 867–869;
3. "Self-Sustained Picosecond Pulse Generation in a GaAlAs laser at an Electrically Tunable Repetition Rate by Optoelectronic Feedback", K. Y. Lau, A. Yariv, *Appl. Phys. Lett.* 45 (2), 15 July 1984 pp. 124–126;
4. "Mutual Phase Locking of a Coupled Laser Diode-Gunn Diode Pair", S. H. Izadpanah, Z. Rav-Noy, S. Mukai, S. Margalit and Amnon Yariv *Appl. Phys. Lett.* 45 (6), 15 Sept. 1984, pp. 609, 610;
5. "Narrow Spectral Linewidth Characteristics of Monolithic Integrated-Passive-Cavity InGaAsP/InP Semiconductor Lasers", T. Fujita, J. Ohya, K. Matsuda, M. Ishino, H. Sato, H. Serizawa, *Electronics Letters,* Vol. 21, No. 9, 25 April 1985, pp. 374, 375;
6. "Active Mode-Locking of an InGaAsP 1.55 $\mu$m Laser in a Fibre Resonator with an Integrated Single-Mode-Fibre Output Port", G. Eisenstein, R. S. Tucker, S. K. Korotky, U. Koren, J. J. Veselka, L. W. Stulz, R. M. Jopson, K. L. Hall, *Electronics Letters,* Vol. 21, No. 5, 28 Feb. 1985, pp. 173–175.

SUMMARY OF THE INVENTION

Briefly, and in general terms, the invention provides a self-mode-locked laser system which includes a semiconductor laser diode having a first facet and a second facet. Suitable reflective coatings are applied to the first and second facets so that a resonant cavity may be formed and optical radiation is emitted from the second facet when the diode is driven. An optical system is provided which reflects at least a portion of the optical radiation back into the diode thereby inducing self-coupling in the laser and the production of an oscillating light pulse. An electronic gain system is coupled to the laser for controlling the oscillating light pulse for producing sustained steady state or mode-locked oscillation.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF THE PREFERRED EMBODIMENT

Figure 1:
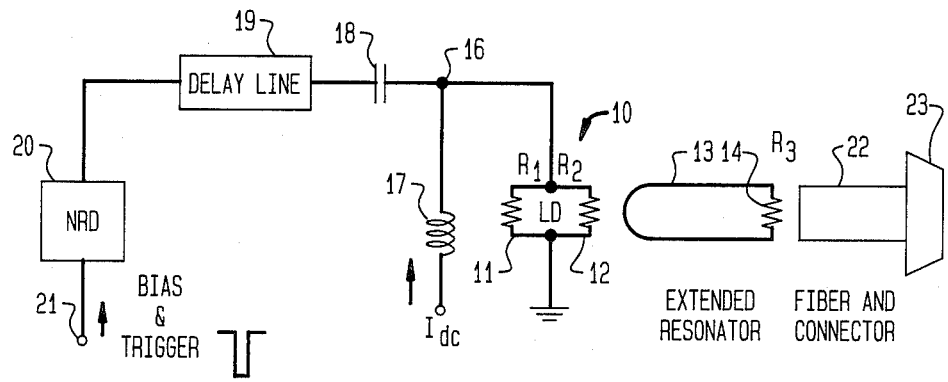
FIG. 1 shows a highly simplified schematic drawing of the laser according to the present invention.

The self-sustained mode-locked laser according to the present invention is shown in a highly simplified schematic form in FIG. 1. The Figure depicts a laser diode (LD) chip 10, such as the Ortel LW600, manufactured by Ortel Corp. of Alhambra, Calif.

The laser diode chip LD includes two spaced-apart facets 11 and 12. In accordance with the present invention, the reflectivity R1 of one facet 11 of the laser diode chip 10 is about 100%, and the reflectivity R2 of the other facet 12 of the laser diode chip 10 is about zero. Such reflectivities may be implemented on the facets by suitable coatings applied thereto by techniques known in the art.

One terminal of the laser diode chip 10 is connected to ground, while the other terminal is connected to a node 16. The node 16 is in turn connected to one terminal of a conventional choke 17 and to one terminal of a capacitor 18. A dc laser driving current Idc of about 30 ma is applied to the other terminal of the choke 17, as depicted in the Figure, for driving the laser diode chip 10 as is known in the art.

An external optical cavity 13 is provided which is disposed adjacent the laser chip 10 such that light emitted from the facet 12, is focused in the cavity 13. Cavity 13 could be an integrated passive cavity or extended resonator or a length of single-mode optical fiber, 2 to 4 inches long, with an integral microlens on the end next to facet 12, while the other end 14 consists of a facet with partially reflectivity R3 between 50 to 70%.

Since facet 11 of the chip 10 is fully reflective, and R3 is partially reflective, an optical resonant cavity is formed by the internal laser cavity coupled with the external mirror cavity 13. The operation of such a resonant cavity in connection with mode-locked lasers is known in the art and is described more particularly in U.S. Pat. No. 4,464,759 herein incorporated by reference. The end 14 may be coupled to a conventional fiber 22 and to a conventional fiber connector 23 for transmitting the optical pulses from the laser 10 to an external optical device, another fiber or for direct application.

Figure 3:
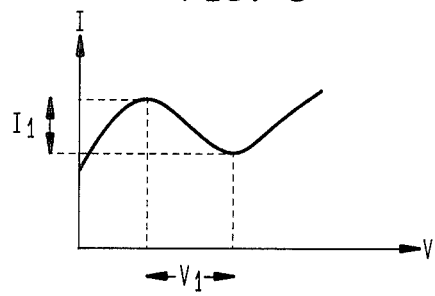
FIG. 3 shows a graph of the current voltage characteristic associated with the negative resistance device used in the present invention.

An electronic gain circuit is coupled to the laser diode chip 10 to provide electronic means for controlling the oscillating light pulse in the diode 10 to produce sustained steady state oscillation. Most particularly, the circuit includes a negative resistance device (NRD) 20 to act as the electronic gain element which is placed in series with a delay line 19, such as a short length of transmission line or microstrip 0.1 to 3 inches long, for the proper feedback delay. The negative resistance device 20 preferably consists of a tunnel diode or a Gunn diode which has an I-V characteristic with a negative slope portion such as shown in FIG. 3. The device 20 is provided with a suitable biasing and triggering pulse from a source 21 so as to operate in the $I_1$-$V_1$ portion of the characteristic shown in FIG. 3. The result of operating the device 20 in such characteristic region is to provide an electronically driven system in conjunction with an injection locked oscillator which reaches the steady state operation from an initial imposed transient.

More particularly, the circuit operates as following:

At t=0, the laser current Idc to the laser diode chip 10 is switched on (or if the laser is prebiased a trigger pulse is applied). The step jump in the current causes a transient, the so-called relaxation oscillation, to be induced in the emitted light from the laser 10 and hence the existence of an ac component on the laser diode current. Under the usual circumstances the amplitude of oscillating light would decay in time and the oscillation would vanish over a few nanosecond time interval. However, in the present invention, associated with the laser, there exists an electronic gain system so that the oscillation can be made to build up and reach steady state through a regenerative loop and feedback mechanism. Therefore the starting ringing will be used as the ac signal required for mode-locking. The modulating ac signal is sustained by coupling the initial ac current cycle to an amplifier—the device 20—properly delayed through delay line 19, and returning to the diode chip 10. The amplified returned signal is phased so that it will enhance the laser gain which, after a few cycles of "growing transients", produces a steady-state repetitive optical pulsation which is coupled through the cavity 13 to the output fiber 22.

Figure 2:
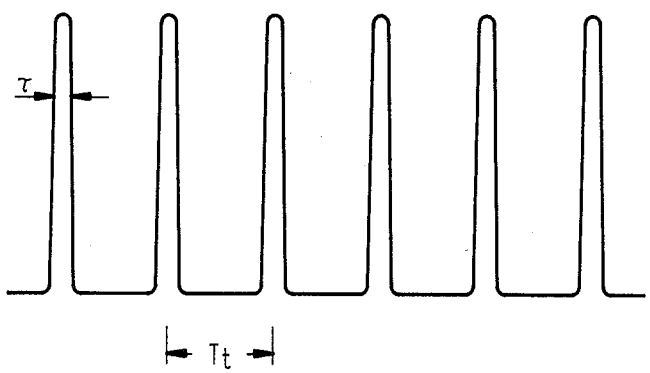
FIG. 2 shows a graph of the self-sustained output of the laser according to the present invention.

It should be noted that due to the "impulse" nature of a mode-locked laser, the circulating ac current component has an "impulse" shape as shown in FIG. 2. This is a highly desirable feature in active mode-locking so that the laser is pumped by the impulse and generates a high number of different resonant frequencies or modes during a time much shorter than the pulsation period. Therefore, the high number of modes stay at relative constant phase and contribute to overall mode-locking. The impulse shape of ac current is preserved in the loop by the usage of a suitable broadband microstrip transmission line as the delay line 19.

The steady state pulse train has a repetition frequency $f=1/T_t$ where $T_t$ is the round trip time in the optical cavity. The total delay in the electrical circuit is:

$$T_t(\text{total}) = T_t(\text{interconnection and components delay}) + T_d(\text{delay line}). \quad (1)$$

This time delay must satisfy the following relation:

$$2\pi f T_t(\text{total}) = 2m\pi \quad (2)$$

where m is an integer.

The result of the operation of the circuit is generation of an optical pulse such as shown in FIG. 2 with a pulse width t and pulse repetition period $T_t$. The specification of such parameters is related to the specific laser diode chip 10 selected, the length of the resonator 13, and the electronic driving characteristics, and may be selected by those skilled in the art to obtain a desired output pulse shaped and frequency. As explained above, the initial transient in the laser light/current is electronically amplified, delayed, and returned to the diode 10. The laser gain modulation achieved in this way together with the extended optical cavity 13 results in a self-sustained mode-locked semiconductor laser operation.

For monolithic integration, the laser diode 10 and the NRD 20 can be fabricated on the same semiconductor chip with a deposited microstrip transmission delay line 19. In the compact form, the laser diode 10 and the negative resistance device 20 are bonded to a proper length of microstrip transmission delay line 19 without the capacitor 18. Self-sustained active mode-locked laser is achieved by using the NRD 20 and the laser diode 10 in a regenerative loop. The system takes advantage of circuit transients to produce sustained steady state operation.

The present invention has the following features:
1. No external high power RF source is required to modulate the laser;
2. Pulsation temporal stability is improved due to the closed loop injection locking;
3. By using the switch on transients, no triggering input signal is needed;
4. As Gunn devices inherently produce "spiky" waveforms, laser gain modulation is obtained in short time compared to oscillation period. This is a required condition to generate high number of competing modes;
5. The circuit is compatible for monolithic and/or hybrid integration.

Such a mode-locked laser diode with the electrical feedback according to the present invention is a highly stable optical source and can be used as a local oscillator or an optical clock generator in gigabit optical communication systems. As a pulse generator it may be coded externally by a modulator to provide optical data streams of high extinction ratios to increase the system noise immunity margin.

While the invention has been illustrated and described as embodied in a self-mode-locked semiconductor laser diode, it is not intended to be limited to the details shown, since various modifications and structural changes may be made without departing in any way from the spirit of the present invention.

Without further analysis, the foregoing will so fully reveal the gist of the present invention that others can readily adapt it for various applications without omitting features that from the standpoint of prior art fairly constitutes essential characteristics of the generic or specific aspects of this invention, and, therefore, such adaptations should and are intended to be comprehended within the meaning and range of equivalence of the following claims.

What is claimed is:

1. A self mode-locked laser system comprising:
    a semiconductor laser diode having a first facet and a second facet, optical radiation being emitted from said second facet when said diode is driven;
    an optical system disposed to reflect at least a portion of said optical radiation back into said diode thereby inducing self-coupling in said laser to generate an oscillating light pulse; and
    an electronic gain means coupled to said laser for controlling said oscillating light pulse in said laser to produce sustained steady-state oscillation, thereby made locking said laser.

2. A laser system as defined in claim 1, wherein said optical system comprises an optical fiber having one end disposed adjacent said second facet of said laser diode and the other end having a partially reflective coating.

3. A laser system as defined in claim 2, wherein said partially reflective coating has a reflectivity between 50 and 70 percent.

4. A laser sytem as defined in claim 2 wherein said optical fiber is from 2 to 9 inches in length.

5. A laser system as defined in claim 1 wherein said first facet has a reflectivity of 100 percent, and said second facet has a reflectivity of zero percent.

6. A laser system as defined in claim 1, wherein said negative resistance device comprises a Gunn diode operated in the negative slope portion of its current-voltage characteristic.

7. A laser system as defined in claim 1, wherein said delay line comprises a 0.1 to 3 inch length of transmission line.

8. A laser system as defined in claim 1, further comprising a capacitor and an inductor connected to said laser diode.

9. A laser system as defined in claim 8 further comprising a current source connected to one terminal of said inductor for providing a d.c. laser driving current.

* * * * *

UNITED STATES PATENT AND TRADEMARK OFFICE
CERTIFICATE OF CORRECTION

PATENT NO. : 4,734,910

DATED : March 29, 1988

INVENTOR(S) : Hossein Izadpanah

It is certified that error appears in the above-identified patent and that said Letters Patent is hereby corrected as shown below:

Column 6, line 17, after "means" insert --including a negative resistance device connected in series with a delay line --.

Column 6, line 20, "made" should read --mode--.

Signed and Sealed this

Twenty-third Day of May, 1989

Attest:

DONALD J. QUIGG

Attesting Officer

Commissioner of Patents and Trademarks